(12) United States Patent
Kinoshita et al.

(10) Patent No.: US 10,079,298 B2
(45) Date of Patent: Sep. 18, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Akimasa Kinoshita, Matsumoto (JP); Yasuyuki Hoshi, Matsumoto (JP); Yuichi Harada, Matsumoto (JP); Yoshiyuki Sakai, Matsumoto (JP); Masanobu Iwaya, Matsumoto (JP); Mina Ryo, Tsukuba (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/201,211

(22) Filed: Jul. 1, 2016

(65) Prior Publication Data
US 2016/0315186 A1 Oct. 27, 2016

Related U.S. Application Data

(63) Continuation of application No. PCT/JP2015/070336, filed on Jul. 15, 2015.

(30) Foreign Application Priority Data

Jul. 23, 2014 (JP) ................ 2014-150256

(51) Int. Cl.
*H01L 29/10* (2006.01)
*H01L 29/04* (2006.01)
(Continued)

(52) U.S. Cl.
CPC ...... *H01L 29/7811* (2013.01); *H01L 29/0878* (2013.01); *H01L 29/1095* (2013.01);
(Continued)

(58) Field of Classification Search
CPC ......... H01L 29/10; H01L 29/04; H01L 29/06; H01L 29/16; H01L 29/78
See application file for complete search history.

(56) References Cited

U.S. PATENT DOCUMENTS

| 6,165,822 A * | 12/2000 | Okuno ........... H01L 21/049 257/E21.063 |
| 2001/0012653 A1 | 8/2001 | Tsukamoto |

(Continued)

FOREIGN PATENT DOCUMENTS

| CN | 101174568 A | 5/2008 |
| JP | 2000-012856 A | 1/2000 |

(Continued)

OTHER PUBLICATIONS

W. G. Perkins et al., "Diffusion and Permeation of He, Ne, Ar, Kr, and $D_2$ through Silicon Oxide Thin Films", J. Chem. Phys., vol. 54, No. 4, pp. 1683-1694, Feb. 15, 1971.

(Continued)

*Primary Examiner* — Joseph C Nicely
*Assistant Examiner* — Lamont Koo
(74) *Attorney, Agent, or Firm* — Rabin & Berdo, P.C.

(57) ABSTRACT

A semiconductor device includes on an n-type semiconductor substrate of silicon carbide, an n-type semiconductor layer, a p-type base region, an n-type source region, a p-type contact region, a gate insulating film, a gate electrode, and a source electrode. The semiconductor device has a drain electrode on a back surface of the semiconductor substrate. On a surface of the gate electrode, an interlayer insulating film is disposed. The interlayer insulating film has plural layers among which, one layer is formed by a silicon nitride film. With such a structure, degradation of semiconductor (Continued)

device properties are suppressed. Further, increases in the number of processes at the time of manufacturing are suppressed.

12 Claims, 5 Drawing Sheets

(51) Int. Cl.
    *H01L 29/06*     (2006.01)
    *H01L 29/16*     (2006.01)
    *H01L 29/78*     (2006.01)
    *H01L 29/40*     (2006.01)
    *H01L 29/417*    (2006.01)
    *H01L 29/66*     (2006.01)
    *H01L 29/08*     (2006.01)

(52) U.S. Cl.
    CPC ...... *H01L 29/408* (2013.01); *H01L 29/41741* (2013.01); *H01L 29/41775* (2013.01); *H01L 29/66068* (2013.01); *H01L 29/045* (2013.01); *H01L 29/0615* (2013.01); *H01L 29/0661* (2013.01); *H01L 29/1608* (2013.01); *H01L 29/7815* (2013.01)

(56) References Cited

U.S. PATENT DOCUMENTS

| | | |
|---|---|---|
| 2004/0159865 A1* | 8/2004 | Allen .................. H01L 21/7605 257/280 |
| 2006/0057796 A1 | 3/2006 | Harada et al. |
| 2008/0102591 A1* | 5/2008 | Nakamura ........... H01L 21/049 438/308 |
| 2009/0114982 A1 | 5/2009 | Saka et al. |
| 2012/0132912 A1 | 5/2012 | Suekawa et al. |

FOREIGN PATENT DOCUMENTS

| | | |
|---|---|---|
| JP | 2002-184987 A | 6/2002 |
| JP | 2008-098593 A | 4/2008 |
| JP | 2012-129503 A | 7/2012 |
| WO | WO-2004-036655 A1 | 4/2004 |

OTHER PUBLICATIONS

W. M. Arnoldbik et al., "Dynamic behavior of hydrogen in silicon nitride and oxynitride films made by low-pressure chemical vapor deposition", Phys. Rev. B, vol. 48, No. 8, pp. 5444-5456, Aug. 15, 1993.

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/070336 filed on Jul. 15, 2015 which claims priority from a Japanese Patent Application No. 2014-150256 filed on Jul. 23, 2014, the contents of which are incorporated herein by reference.

BACKGROUND OF THE INVENTION

1. Field of the Invention

The present invention relates to a semiconductor device and a method of manufacturing a semiconductor device.

2. Description of the Related Art

High temperature gate bias (HTGB) tests are conducted with respect to metal oxide semiconductor field-effect transistors (MOSFET) that use silicon carbide (SiC). In a HTGB test, voltage is applied between a gate and a source for a long period of time in a high temperature environment. During the HTGB test, a threshold voltage (Vth) between the gate and source is known to decrease.

The threshold voltage decreases consequent to the diffusion of an impurity from an external source. A method of forming, for example, a titanium (Ti) alloy that prevents the diffusion of impurities into the surface of the MOSFET has been disclosed to suppress decreases in the threshold voltage (for example, refer to Japanese Laid-Open Patent Publication No. 2012-129503). The diffusion coefficient of a silicon nitride film is smaller than that of a silicon oxide ($SiO_2$) film, thus use of a silicon nitride (SiN) film is also conceivable to prevent the diffusion of impurities (for example, refer to Perkins, W. G., et al, "Diffusion and Permeation of He, Ne, Ar, Kr, and D2 through Silicon Oxide Thin Films", J. Chem. Phys., Vol. 54, No. 4, pp. 1683-1694, (1971); and Arnoldbik, W. M., et al, "Dynamic behavior of hydrogen in silicon nitride and oxynitride films made by low-pressure chemical vapor deposition", Phys. Rev. B, Vol. 48, No. 8, pp. 5444-5456, (1993)).

SUMMARY OF THE INVENTION

Nonetheless, since MOS surface structures are complicated, when a barrier metal of a titanium alloy is formed on a MOS structure, a portion of the barrier metal may be deficient, whereby the threshold voltage may decrease. Further, when an electrode pad is formed using aluminum (Al), a problem arises in that the number of processes at the time of manufacture increases since the etching methods differ for a titanium alloy, which forms the barrier metal, and aluminum. Further, when a silicon nitride film is used, the degree of hardness of the silicon nitride film is high, making the silicon nitride film unsuitable in forming complicated surface structures such as that of a MOS.

According to one aspect of the present invention, a semiconductor device includes a semiconductor substrate formed of silicon carbide of a first conductivity type; and a semiconductor layer of the first conductivity type and having an impurity concentration that is lower than that of the semiconductor substrate is disposed on a first principal surface of the semiconductor substrate. A base region of a second conductivity type is disposed on a surface of the semiconductor layer; and a source region of the first conductivity type is disposed in a surface region of the base region. A contact region of the second conductivity type and having an impurity concentration that is higher than that of the base region is disposed in a surface region of the base region; and a source electrode that contacts the source region and the contact region is disposed. A gate insulating film is disposed on a surface of the base region between the semiconductor layer and the source region; and a gate electrode is disposed on a surface of the gate insulating film. An interlayer insulating film is disposed on a surface of the gate electrode; and a drain electrode is disposed on a second principal surface of the semiconductor substrate. The interlayer insulating film includes plural layers and among the plural layers at least one layer that is a first layer is formed from a silicon nitride film.

According to another aspect of the invention, a semiconductor device includes a semiconductor substrate formed of silicon carbide of a first conductivity type; and a semiconductor layer of the first conductivity type is disposed on a first principal surface of the semiconductor substrate and has an impurity concentration that is lower than that of the semiconductor substrate. A semiconductor region of a second conductivity type is disposed in a portion of a surface region of the semiconductor layer; and a base region is disposed on a surface of the semiconductor region and has an impurity concentration that is lower than that of the semiconductor region. A well region formed of a silicon carbide of the first conductivity type is disposed on the surface of the semiconductor layer, contacts the base region, and has an impurity concentration that is lower than that of the semiconductor substrate. A source region of the first conductivity type is disposed in a surface region of the base region and away from the well region, and has an impurity concentration that is higher than that of the well region. A contact region of the second conductivity type is disposed in a surface of the base region and contacts the source region, and has an impurity concentration that is higher than that of the base region. A source electrode contacting the source region and the contact region is disposed. A gate insulating film is disposed on a surface of the base region between the well region and the source region; and a gate electrode is disposed on a surface of the gate insulating film. An interlayer insulating film is disposed on a surface of the gate electrode; and a drain electrode is disposed on a second principal surface of the semiconductor substrate. The interlayer insulating film includes plural layers and among the plural layers, at least one layer that is a first layer formed from a silicon nitride film.

Further, in the interlayer insulating film, the first layer is sandwiched by a second layer formed from a silicon oxide film.

Further, in the interlayer insulating film, the first layer has a thickness of at least 0.2 μm.

Further, in the interlayer insulating film, the second layer that is on the first layer is formed from a glass in which boron and phosphorus are added to silicon oxide.

Further, in the interlayer insulating film, the first layer is an uppermost layer of the interlayer insulating film.

Further, in the interlayer insulating film, the first layer has a thickness of at least 0.5 μm.

Further, a crystallographic plane index (Miller index) of the first principal surface of the semiconductor substrate is a plane parallel to or a plane tilted within 10 degrees with respect to a (000-1) plane.

Further, a crystallographic plane index of the first principal surface of the semiconductor substrate is a plane parallel to or a plane tilted within 10 degrees with respect to a (0001) plane.

A method of manufacturing a semiconductor device according to the present invention includes forming an interlayer insulating film to include plural layers and among the plural layers, at least one layer is formed from a silicon nitride film. The semiconductor device includes a semiconductor substrate formed of silicon carbide of a first conductivity type; a semiconductor layer of the first conductivity type, formed on a first principal surface of the semiconductor substrate, and having an impurity concentration that is lower than that of the semiconductor substrate; a base region of a second conductivity type and formed on a surface of the semiconductor layer; a source region of the first conductivity type and formed in a surface region of the base region; a contact region of the second conductivity type, formed in a surface region of the base region, and having an impurity concentration that is higher than that of the base region; a source electrode contacting the source region and the contact region; a gate insulating film formed on a surface of the base region between the semiconductor layer and the source region; a gate electrode formed on a surface of the gate insulating film; the interlayer insulating film formed on a surface of the gate electrode; and a drain electrode formed on a second principal surface of the semiconductor substrate.

A method of manufacturing a semiconductor device according to the present invention includes forming an interlayer insulating film to include plural layers and among the plural layers, at least one layer is formed from a silicon nitride film. The semiconductor device includes a semiconductor substrate formed of silicon carbide of a first conductivity type; a semiconductor layer of the first conductivity type, formed on a first principal surface of the semiconductor substrate, and having an impurity concentration that is lower than that of the semiconductor substrate; a semiconductor region of a second conductivity type and formed in a portion of a surface region of the semiconductor layer; a base region formed on a surface of the semiconductor region and having an impurity concentration that is lower than that of the semiconductor region; a well region formed of a silicon carbide of the first conductivity type, on the surface of the semiconductor layer and contacting the base region, and having an impurity concentration that is lower than that of the semiconductor substrate; a source region of the first conductivity type, formed in a surface region of the base region and away from the well region, and having an impurity concentration that is higher than that of the well region; a contact region of the second conductivity type, formed in a surface of the base region and contacting the source region, and having an impurity concentration that is higher than that of the base region; a source electrode contacting the source region and the contact region; a gate insulating film formed on a surface of the base region between the well region and the source region; a gate electrode formed on a surface of the gate insulating film; the interlayer insulating film formed on a surface of the gate electrode; and a drain electrode formed on a second principal surface of the semiconductor substrate.

The other objects, features, and advantages of the present invention are specifically set forth in or will become apparent from the following detailed description of the invention when read in conjunction with the accompanying drawings.

DETAILED DESCRIPTION OF THE INVENTION

Figure 1:
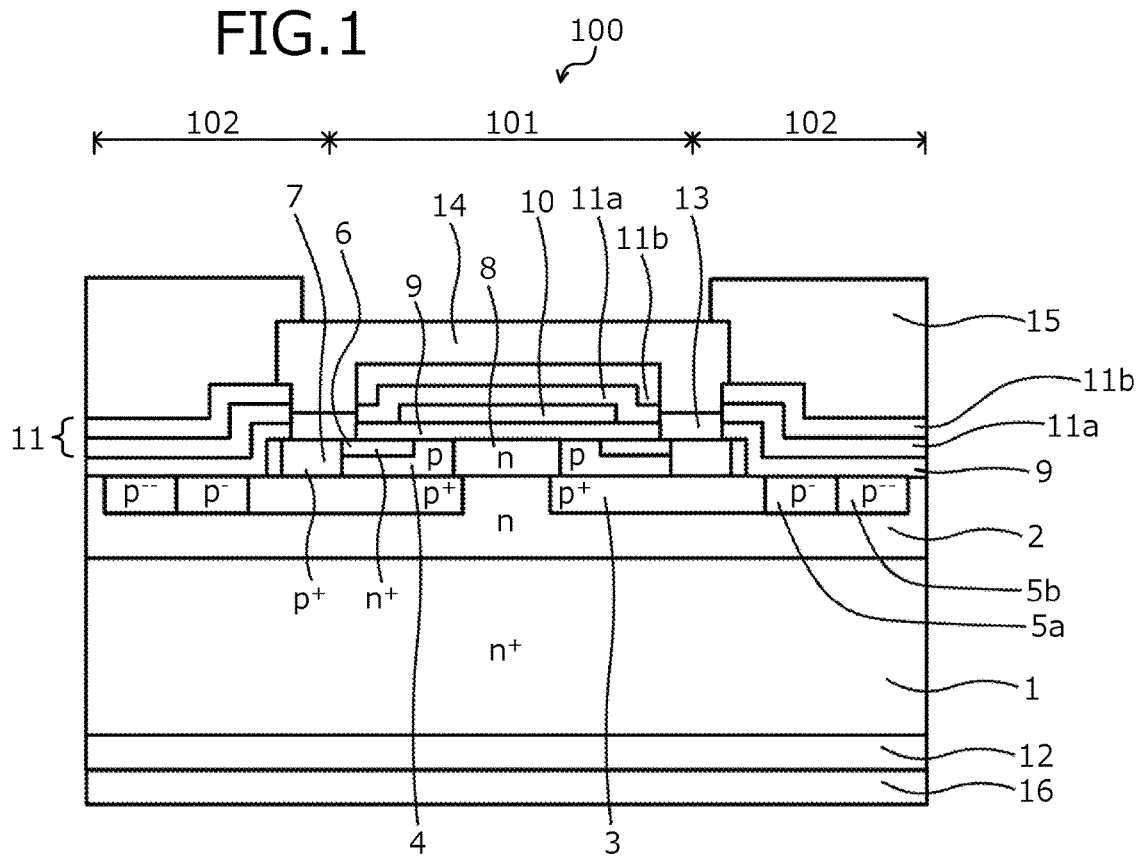
FIG. 1 is a cross-sectional view of an example of a semiconductor device according to a first embodiment of the present invention.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described. Further, −− appended to p means that the impurity concentration is lower than that of p-type layers and regions appended with −. Further, in the present description, when Miller indices are described, "−" means a bar added to an index immediately after the "−", and a negative index is expressed by prefixing "−" to the index.

Here, although description will be given taking a 1200V rated MOSFET as an example of the semiconductor device, the semiconductor device according to the present invention is not limited to a 1200V rated MOSFET. In the description and accompanying drawings, identical components will be given the same reference numerals and will not be redundantly described.

FIG. 1 is a cross-sectional view of an example of the semiconductor device according to a first embodiment of the present invention. As depicted in FIG. 1, a semiconductor device 100 according to the first embodiment has an active region 101 and an edge termination structure 102. The edge termination structure 102 may be disposed to encompass the active region 101. The semiconductor device 100 has an n$^+$ semiconductor substrate 1 of silicon carbide and an n semiconductor layer 2.

The n$^+$ semiconductor substrate 1, for example, may be a single crystal silicon carbide substrate in which silicon carbide is doped with nitrogen atoms (N) of an impurity concentration of about $2\times10^{18}/cm^3$. The n$^+$ semiconductor substrate 1, for example, forms a drain region. A crystallographic plane index (Miller index) of a first principal surface of the n$^+$ semiconductor substrate 1 may be, for example, a (000-1) plane. The first principal surface of the n$^+$ semiconductor substrate 1, for example, may be a plane parallel to the (000-1) plane, or a plane tilted 10 degrees or less. The first principal surface of the $n^+$ semiconductor substrate 1, for example, may be a (000-1) plane having an OFF angle of about 4 degrees in a <11-20> direction. In the description of the present embodiment, a front surface of the $n^+$ semiconductor substrate 1 is assumed as the first principal surface and a back surface is assumed as a second principal surface.

The n semiconductor layer 2 is disposed on the first principal surface of the $n^+$ semiconductor substrate 1. The impurity concentration of the n semiconductor layer 2 is lower than that of the $n^+$ semiconductor substrate 1. The n semiconductor layer 2 may be, for example, a semiconductor layer in which silicon carbide is doped with nitrogen atoms of an impurity concentration of about $1 \times 10^{16}/cm^3$. The n semiconductor layer 2, for example, forms an n-type drift layer. The thickness of the n semiconductor layer 2 may be about 10 μm, for example. The n semiconductor layer 2 may be stacked on the $n^+$ semiconductor substrate 1 by an epitaxial growth method.

A structure of the active region 101 will be described. In the active region 101, on a first principal surface side of the $n^+$ semiconductor substrate 1, MOS structures of the semiconductor device 100, i.e., device structures are formed. In the example depicted in FIG. 1, although one MOS structure is depicted in the active region 101, multiple MOS structures may be disposed in parallel.

The semiconductor device 100 has, for example, $p^+$ semiconductor regions 3, p base regions 4, $n^+$ source regions 6, $p^+$ contact regions 7, source electrodes 13, a gate insulating film 9, and a gate electrode 10, as MOS structures. In the active region 101, on the second principal surface side of the $n^+$ semiconductor substrate 1, for example, a back surface electrode forming a drain electrode 12 and a back surface electrode pad forming a drain electrode pad 16 are disposed.

The $p^+$ semiconductor regions 3 are disposed on a portion of a surface region of the n semiconductor layer 2. The $p^+$ semiconductor regions 3 may be disposed, for example, to sandwich another portion of the surface region of the n semiconductor layer 2. The $p^+$ semiconductor regions 3 may be, for example, a semiconductor region where the silicon carbide is doped with aluminum atoms of a concentration of about $3 \times 10^{18}/cm^3$. The width of the $p^+$ semiconductor regions 3 may be, for example, about 13 μm. The depth of the $p^+$ semiconductor regions 3 may be, for example, about 0.5 μm. A region between adjacent $p^+$ semiconductor regions 3 is a region of the n semiconductor layer 2. A distance between adjacent $p^+$ semiconductor regions 3 may be, for example, about 2 μm.

The p base regions 4 are disposed on a surface of the $p^+$ semiconductor regions 3. The impurity concentration of the p base regions 4 is lower than that of the $p^+$ semiconductor regions 3. The p base regions 4 may be, for example, a semiconductor region where silicon carbide is doped with aluminum atoms of a concentration of about $8 \times 10^{15}/cm^3$. The thickness of the p base regions 4 may be, for example, about 0.5 μm. The p base regions 4 may be formed by patterning a p semiconductor layer stacked on the n semiconductor layer 2 by an epitaxial growth method.

An n well region 8 is disposed on the surface of the n semiconductor layer 2, at the region that is between adjacent $p^+$ semiconductor regions 3. The n well region 8 is disposed contacting the p base regions 4. The impurity concentration of the n well region 8 is lower than that of the $n^+$ semiconductor substrate 1. The impurity concentration of the n well region 8 may be, for example, about $2 \times 10^{16}/cm^3$. The n well region 8, for example, as described above, may be a region in which the conductivity of a portion of the p semiconductor layer stacked on the n semiconductor layer 2 by an epitaxial growth method is reversed by ion implantation of phosphorus atoms and heat treatment. Silicon atoms (Si) of a portion of the n well region 8 are replaced by the ion implanted phosphorus atoms. The n well region 8, for example, forms the n semiconductor layer 2 and an n-type drift region. The depth of the n well region 8 may be, for example, about 0.6 μm. The width of the n well region 8 may be, for example, about 2 μm.

The $n^+$ source regions 6 are disposed on a surface region of the p base regions 4 on the $p^+$ semiconductor regions 3. The $n^+$ source regions 6 are disposed away from the n well region 8. The impurity concentration of the $n^+$ source regions 6 is higher than that of the n well region 8.

The $p^+$ contact regions 7 are disposed opposing the n well region 8 with the p base regions 4 therebetween, i.e., is disposed away from the n well region 8, toward the edge termination structure 102. The $p^+$ contact regions 7 contact the $n^+$ source regions 6. The $p^+$ contact regions 7, for example, as described, penetrate the p semiconductor layer that forms the p base regions 4 on the n semiconductor layer 2 and contacts the $p^+$ semiconductor regions 3. The impurity concentration of the $p^+$ contact regions 7 is higher than that of the p base regions 4.

The gate insulating film 9 is disposed on a surface of the p base regions 4, at a region between the n well region 8 and the $n^+$ source regions 6. The gate insulating film 9, for example, may extend from the surface of a first p base region 4 adjacent to the n well region 8, across a surface of the n well region 8, to the surface of a second p base region 4 adjacent to the n well region 8 and opposing the first p base region 4 via the n well region 8. The gate insulating film 9, for example, may extend to the edge termination structure 102. The gate insulating film 9 may be, for example, an oxide film. The thickness of the gate insulating film 9 may be, for example, about 100 nm.

The gate electrode 10 is disposed on a surface of the gate insulating film 9. The gate electrode 10, for example, may extend from a position above the first p base region 4 and pass over the n well region 8 to a position above the second p base region 4. The gate electrode 10 may be formed using a conductive material. The gate electrode 10 may be formed using, for example, polycrystalline silicon doped with phosphorus atoms. The gate electrode 10, for example, may be electrically connected to a gate pad in a region not appearing in FIG. 1.

The gate electrode 10 is covered by an interlayer insulating film 11. The interlayer insulating film 11 extends to the edge termination structure 102 and is disposed on an entire side where the gate electrode 10 is disposed. The interlayer insulating film 11 has a multi-layer structure and, for example, may have a silicon oxide film 11a at a lower layer and a silicon nitride film 11b at an upper layer. The silicon oxide film 11a, for example, may be formed using a non-doped silicate glass (NSG) or may be formed using a phosphor silicate glass (PSG). The thickness of the silicon oxide film 11a may be, for example, about 0.5 μm. The thickness of the silicon nitride film 11b may be, for example, 3 μm or less. The thickness of the silicon nitride film 11b may be, for example, about 0.5 μm.

The source electrodes 13, for example, are disposed in contact holes that penetrate the interlayer insulating film 11 disposed in the active region 101 and the edge termination structure 102, and the gate insulating film 9 disposed in the active region 101 and the edge termination structure 102.

The source electrodes 13 contact the n+ source regions 6 and the p+ contact regions 7. The source electrodes 13 are electrically connected to the n+ source regions 6 and the p+ contact regions 7. The source electrodes 13 are insulated from the gate electrode 10 by the interlayer insulating film 11.

The semiconductor device 100 may have a source electrode pad 14. The source electrode pad 14 is disposed so as to cover the source electrodes 13 and the interlayer insulating film 11 in the active region 101. The source electrode pad 14 contacts the source electrodes 13. The source electrode pad 14 is electrically connected to the source electrodes 13. The thickness of the source electrode pad 14 at a portion on the interlayer insulating film 11 may be, for example, 5 μm. The source electrode pad 14 may be formed using, for example, aluminum (Al).

The drain electrode 12 is disposed on the second principal surface of the n+ semiconductor substrate 1. The drain electrode 12 may be formed using a conductive film, for example, a metal film. The drain electrode 12 may be formed using, for example, nickel (Ni). The drain electrode 12 forms an ohmic contact with the n+ semiconductor substrate 1.

The drain electrode pad 16 is disposed on a surface of the drain electrode 12. The drain electrode pad 16 may be formed using a conductive film, for example, a metal film. The drain electrode pad 16 may be formed by, for example, titanium (Ti), nickel, and gold (Au) sequentially stacked from the drain electrode 12. The drain electrode pad 16 is electrically connected to the drain electrode 12.

A structure of the edge termination structure 102 will be described. The semiconductor device 100 may have a p⁻ semiconductor region 5a, a p⁻⁻ semiconductor region 5b, and a protective film 15 in the edge termination structure 102.

The p⁻ semiconductor region 5a is disposed on a portion of the surface region of the n semiconductor layer 2 in the edge termination structure 102. The p⁻ semiconductor region 5a contacts, for example, the p+ semiconductor region 3. The p⁻ semiconductor region 5a may be disposed so as to surround the p+ semiconductor regions 3. The p⁻ semiconductor region 5a may be, for example, a semiconductor region where the silicon carbide is doped with aluminum atoms. The impurity concentration of the p⁻ semiconductor region 5a is lower than that of the p+ semiconductor regions 3.

The p⁻⁻ semiconductor region 5b is disposed in a portion of the surface region of the n semiconductor layer 2 in the edge termination structure 102. The p⁻⁻ semiconductor region 5b contacts, for example, the p⁻ semiconductor region 5a. The p⁻⁻ semiconductor region 5b may be disposed so as to surround the p⁻ semiconductor region 5a. The p⁻⁻ semiconductor region 5b may be, for example, a semiconductor region in which silicon carbide is doped with aluminum atoms. The impurity concentration of the p⁻⁻ semiconductor region 5b is lower than that of the p⁻ semiconductor region 5a.

In this manner, by the first p⁻ type region 5a and the second p⁻⁻-type region 5b, the semiconductor device 100 may have a double-zone junction termination extension (JTE) structure in which two p-type regions of differing impurity concentrations are parallel so as to contact each other. Without limitation to a double-zone JTE structure, the semiconductor device 100 may have a multi-zone JTE structure in which 3 or more p-type regions of differing impurity concentrations are parallel so as to contact each other. Further, the semiconductor device 100 may have, for example, a termination structure in which multiple p-type regions are disposed a predetermined interval so as to form a field limiting ring structure.

The protective film 15 may be disposed so as to cover an edge termination structure 102 side of the source electrode pad 14. The protective film 15 forms a passivation film. The protective film 15 has a function of preventing discharge. The protective film 15 may be formed of, for example, polyimide.

Figure 2:
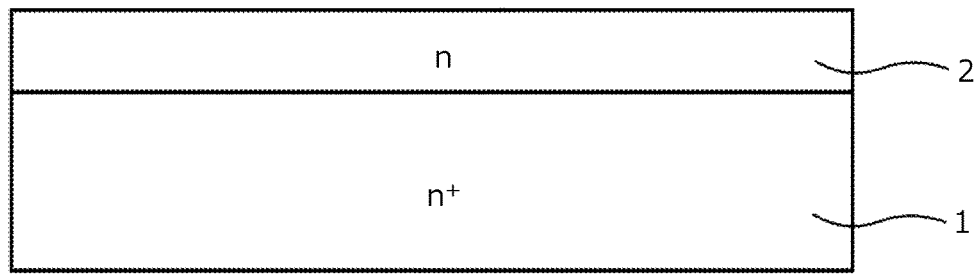
FIG. 2 is a cross-sectional view of a state during manufacture in an example of a method of manufacturing a semiconductor device according to the first embodiment.
Figure 3:
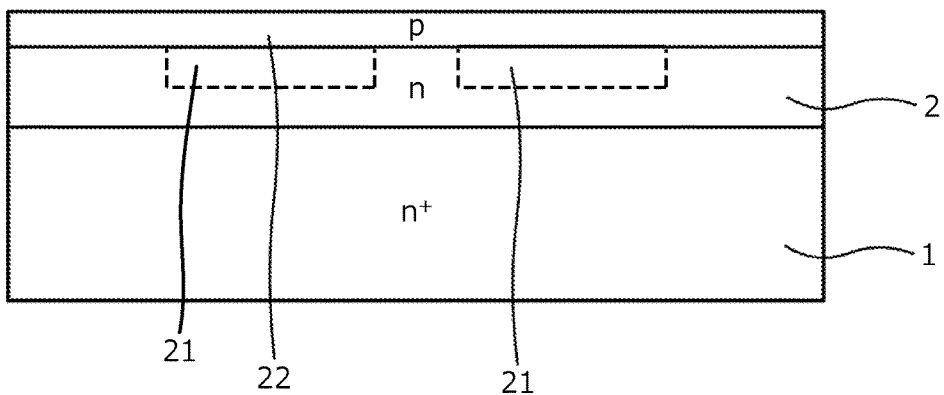
FIG. 3 is a cross-sectional view of a state subsequent to the state depicted in FIG. 2.
Figure 4:
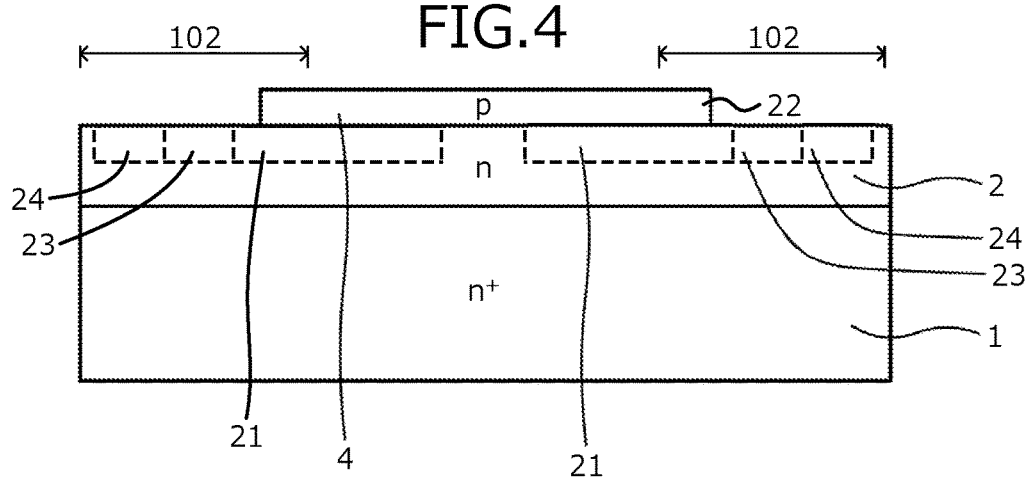
FIG. 4 is a cross-sectional view of a state subsequent to the state depicted in FIG. 3.
Figure 5:
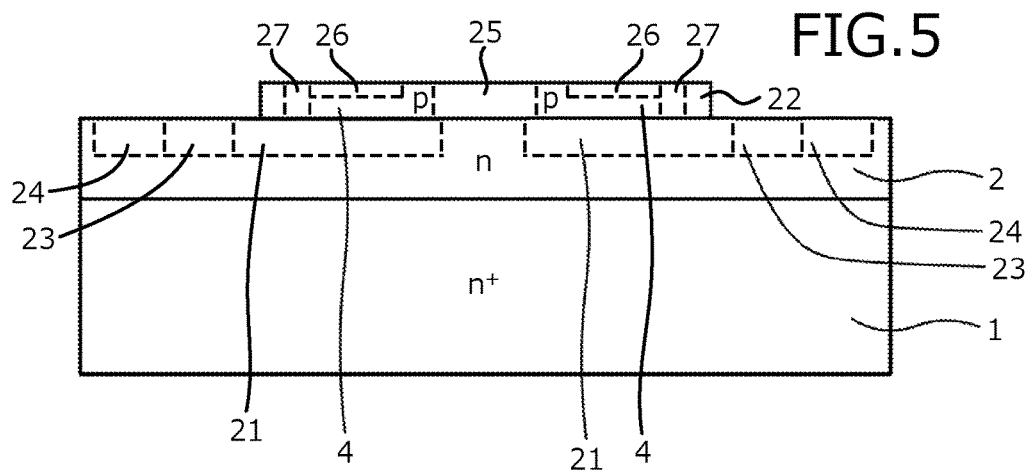
FIG. 5 is a cross-sectional view of a state subsequent to the state depicted in FIG. 4.
Figure 6:
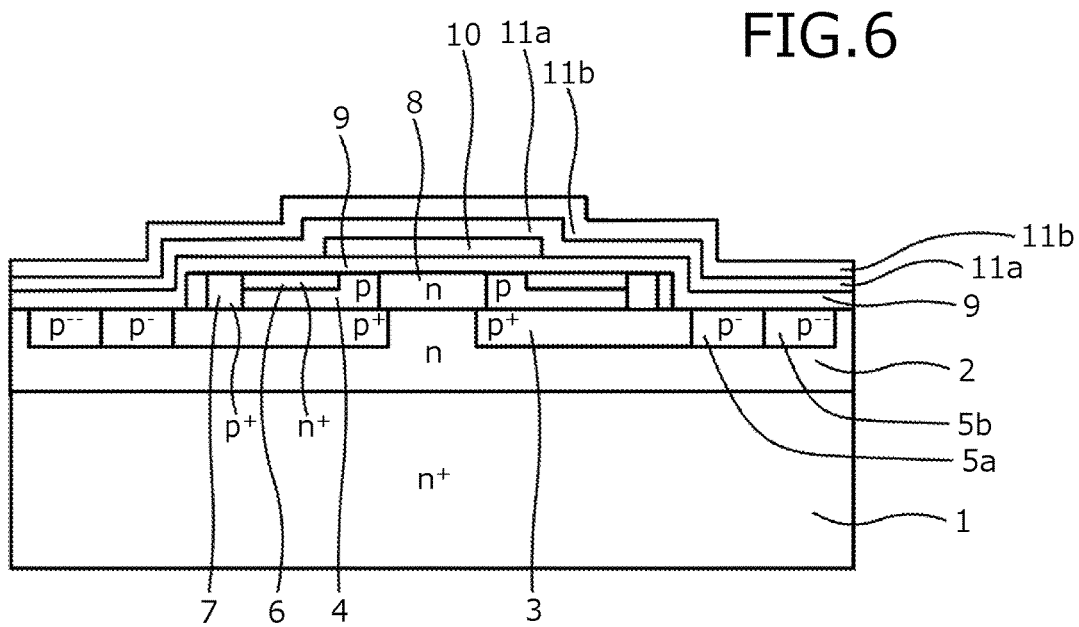
FIG. 6 is a cross-sectional view of a state subsequent to the state depicted in FIG. 5.

FIG. 2 is a cross-sectional view of a state during manufacture in an example of the method of manufacturing a semiconductor device according to the first embodiment. FIG. 3 is a cross-sectional view of a state subsequent to the state depicted in FIG. 2. FIG. 4 is a cross-sectional view of a state subsequent to the state depicted in FIG. 3. FIG. 5 is a cross-sectional view of a state subsequent to the state depicted in FIG. 4. FIG. 6 is a cross-sectional view of a state subsequent to the state depicted in FIG. 5.

As depicted in FIG. 2, the n+ semiconductor substrate 1 formed of an n-type silicon carbide is prepared. On the first principal surface of the n+ semiconductor substrate 1, an n-type impurity, for example, nitrogen atoms are doped while the n semiconductor layer 2 formed of silicon carbide, for example, is epitaxially grown to a thickness of about 10 The state up to this point is depicted in FIG. 2.

As depicted in FIG. 3, on the surface of the n semiconductor layer 2, a mask (not depicted) that has a predetermined opening is formed by a photolithographic technique. A p-type impurity, e.g., aluminum atoms, is ion implanted, whereby as depicted by dotted lines in FIG. 3, in a portion of a surface region of the n semiconductor layer 2, for example, first ion implanted regions 21 having a width of about 13 μm and a depth of about 0.5 μm are disposed so that, for example, a distance between adjacent first ion implanted regions 21 is about 2 μm. The first ion implanted regions 21, for example, become the p+ semiconductor regions 3 through heat treatment described hereinafter. A dosing amount in the ion implantation to dispose the first ion implanted regions 21, for example, may be set so that the impurity concentration of the p+ semiconductor regions 3 becomes about $3 \times 10^{18}/cm^3$.

The mask used in the ion implantation to dispose the first ion implanted regions 21 is removed. On the surface of the n semiconductor layer 2, a p-type impurity, for example, aluminum atoms are doped while a second semiconductor layer 22 formed of silicon carbide, for example, is epitaxially grown to a thickness of about 0.5 μm. The second semiconductor layer 22, for example, becomes the p base regions 4 through a photolithographic technique and an etching process described hereinafter. A dosing amount in the ion implantation to dispose the second semiconductor layer 22, for example, may be set so that the impurity concentration of the p base regions 4 becomes about $8 \times 10^{15}/cm^3$. The state up to this point is depicted in FIG. 3.

As depicted in FIG. 4, on the surface of the second semiconductor layer 22, a mask (not depicted) that has a predetermined opening is formed by a photolithographic technique. An etching process is performed to pattern the second semiconductor layer 22, whereby the p base regions 4 are formed and at a region becoming the edge termination structure 102, the second semiconductor layer 22, for example, is removed to a depth of about 0.7 μm, exposing the n semiconductor layer 2. The mask used in the etching process for patterning the second semiconductor layer 22 is removed.

On the exposed surface of the n semiconductor layer 2 and on the surface of the p base regions 4, a mask (not depicted) that has a predetermined opening is formed by a photolithographic technique. A p-type impurity, e.g., aluminum atoms, is ion implanted, whereby as depicted by dotted lines in FIG. 4, in a portion of the surface region of the n semiconductor layer 2, a second ion implanted region 23 is disposed in a region becoming the edge termination structure 102, for example, so as to be adjacent to the first ion implanted regions 21. The second ion implanted region 23, for example, becomes the p⁻ semiconductor region 5a in the described double-zone JTE structure through the heat treatment described hereinafter. A dosing amount in the ion implantation to dispose the second ion implanted region 23, for example, may be set to about $2 \times 10^{13}/cm^2$. The mask used in the ion implantation to dispose the second ion implanted region 23 is removed.

On the exposed surface of the n semiconductor layer 2 and the surface of the p base regions 4, a mask (not depicted) that has a predetermined opening is formed by a photolithographic technique. A p-type impurity, e.g., aluminum atoms, is ion implanted, whereby as depicted by dotted lines in FIG. 4, in a surface region of the n semiconductor layer 2, a third ion implanted region 24 is disposed in the region the edge termination structure 102, for example, so as to contact the second ion implanted region 23. The third ion implanted region 24, for example, becomes the p⁻⁻ semiconductor region 5b in the described double-zone JTE structure through the heat treatment described hereinafter. A dosing amount in the ion implantation to dispose the third ion implanted region 24, for example, may be set to about $1 \times 10^{13}/cm^2$. The mask used in the ion implantation to dispose the third ion implanted region 24 is removed. The state up to this point is depicted in FIG. 4.

As depicted in FIG. 5, on the exposed surface of the n semiconductor layer 2 and on the surface of the p base regions 4, a mask (not depicted) that has a predetermined opening is formed by a photolithographic technique. An n-type impurity, e.g., phosphorus atoms, is ion implanted, whereby as depicted by dotted lines in FIG. 5, in the second semiconductor layer 22, a fourth ion implanted region 25 of, for example, a width of about 2 μm and a depth of about 0.6 μm is disposed at a region above a region of the n semiconductor layer 2 between adjacent first ion implanted regions 21. The fourth ion implanted region 25, for example, becomes the n well region 8 through the heat treatment described hereinafter. A dosing amount in the ion implantation to dispose the fourth ion implanted region 25, for example, may be set so that the impurity concentration of the n well region 8 becomes about $2 \times 10^{16}/cm^3$. The mask used in the ion implantation to dispose the fourth ion implanted region 25 is removed.

On the exposed surface of the n semiconductor layer 2 and on the surface of the p base regions 4, a mask (not depicted) that has a predetermined opening is formed by a photolithographic technique. An n-type impurity is ion implanted, whereby as depicted by dotted lines in FIG. 5, in a surface region of the second semiconductor layer 22, fifth ion implanted regions 26 are disposed at a region away from the fourth ion implanted region 25. The fifth ion implanted regions 26, for example, become the n⁺ source regions 6 through the heat treatment described hereinafter. A dosing amount in the ion implantation to dispose the fifth ion implanted regions 26 may be set so that the impurity concentration becomes higher than that of the fourth ion implanted region 25. The mask used in the ion implantation to dispose the fifth ion implanted regions 26 is removed.

On the exposed surface of the n semiconductor layer 2 and on the surface of the p base regions 4, a mask (not depicted) that has a predetermined opening is formed by a photolithographic technique. A p-type impurity is ion implanted, whereby as depicted by dotted lines in FIG. 5, in the second semiconductor layer 22, a sixth ion implanted region 27 is disposed in each region above a first ion implanted region 21 and contacting a p base region 4 and a fifth ion implanted region 26. The sixth ion implanted regions 27, for example, become the p⁺ contact regions 7 through the heat treatment described hereinafter. A dosing amount in the ion implantation to dispose the sixth ion implanted regions 27 may be set so that the impurity concentration becomes higher than that of the p base regions 4. The mask used in the ion implantation to dispose the sixth ion implanted regions 27 is removed.

The sequence of the ion implantations to dispose the second ion implanted region 23, the third ion implanted region 24, the fourth ion implanted region 25, the fifth ion implanted regions 26, and the sixth ion implanted regions 27 is not limited hereto and may be modified. The state up to this point is depicted in FIG. 5.

As depicted in FIG. 6, heat treatment (annealing) is performed to activate, for example, the first ion implanted regions 21, the second ion implanted region 23, the third ion implanted region 24, the fourth ion implanted region 25, the fifth ion implanted regions 26, and the sixth ion implanted regions 27. As a result, the first ion implanted regions 21 become the p⁺ semiconductor regions 3. Ion implanted phosphorus atoms replace silicon atoms to reverse the conductivity type whereby the fourth ion implanted region 25 becomes the n well region 8. The fifth ion implanted regions 26 become the n⁺ source regions 6. The sixth ion implanted regions 27 become the p⁺ contact regions 7. The second ion implanted region 23 becomes the p⁻ semiconductor region 5a. The third ion implanted region 24 becomes the p⁻⁻ semiconductor region 5b. The temperature of the heat treatment, for example, may be about 1620 degrees C. The period of the heat treatment, for example, may be about 2 minutes. As described, the ion implanted regions may be collectively activated by performing heat treatment once or heat treatment may be performed each time ion implantation is performed.

The surface of the side on which the p base regions 4, the n⁺ source regions 6, the p⁺ contact regions 7, the n well region 8, the p⁻ semiconductor region 5a, and the p⁻⁻ semiconductor region 5b are disposed is thermally oxidized, for example, to dispose on the entire surface, for example, the gate insulating film 9 having a thickness of about 100 nm. This thermal oxidation process, for example, may be implemented by heat treatment performed in an oxygen atmosphere, for example, at about 1000 degrees C.

On the gate insulating film 9, for example, a polysilicon layer doped with phosphorus atoms is disposed. The polysilicon layer is patterned so that a portion remains on the gate insulating film 9, where the gate insulating film 9 is above a portion of a p base region 4, between an n⁺ source region 6 and the n well region 8, whereby the gate electrode 10 is disposed.

For example, nondoped silicate glass (NSG) or phosphor silicate glass (PSG) is deposited so as to cover the gate insulating film 9 and the gate electrode 10 and have a thickness of, for example, about 0.5 μm, whereby the silicon oxide film 11a forming the lower layer of the interlayer insulating film 11 is disposed. Silicon nitride is deposited so as to cover the silicon oxide film 11a and have a thickness of, for example, about 0.5 μm, whereby the silicon nitride film 11b forming the upper layer of the interlayer insulating film 11 is disposed. The interlayer insulating film 11 is formed by the silicon oxide film 11a and the silicon nitride film 11b. For example, the silicon nitride film 11b may be deposited by a plasma chemical vapor deposition (CVD) method. The state up to this point is depicted in FIG. 6.

As depicted in FIG. 1, the silicon nitride film 11b, the silicon oxide film 11a, and the gate insulating film 9 are patterned and selectively removed, whereby a contact hole is formed, exposing the n$^+$ source regions 6 and the p$^+$ contact regions 7. Thereafter, heat treatment (reflow) is performed and the interlayer insulating film 11 is planarized.

Inside the contact hole and on the interlayer insulating film 11, a conductive film to become the source electrodes 13 is disposed. The conductive film is selectively removed so that, for example, only the source electrodes 13 inside the contact hole remains.

On the second principal surface of the n$^+$ semiconductor substrate 1, for example, the drain electrode 12 formed by a nickel film is disposed. Thereafter, for example, heat treatment is performed at about 970 degrees C. to ohmically bond the n$^+$ semiconductor substrate 1 and the drain electrode 12.

Subsequently, for example, an aluminum (Al) film is disposed by a sputtering method so as to cover the source electrodes 13 and the interlayer insulating film 11 and at a portion above the interlayer insulating film 11, have a thickness of, for example, about 5 μm. Thereafter, the Al film is selectively removed so that a portion remains covering the interlayer insulating film 11 at the source electrodes 13 and the active region 101, to form the source electrode pad 14.

In the region becoming the edge termination structure 102, the protective film 15 formed of, for example, polyimide is disposed so as to cover an end of the source electrode pad 14, on the edge termination structure 102 side.

On the surface of the drain electrode 12, for example, titanium, nickel, and gold are sequentially stacked, whereby the drain electrode pad 16 is disposed. Thus, as described, the semiconductor device 100 depicted in FIG. 1 is completed.

The semiconductor device 100 in which the interlayer insulating film 11 is formed by the lower-layer silicon oxide film 11a and the upper-layer silicon nitride film 11b is assumed as a first example. A semiconductor device where in the semiconductor device 100, the interlayer insulating film 11 is formed by only a silicon oxide film is assumed as a comparative example.

Figure 7:
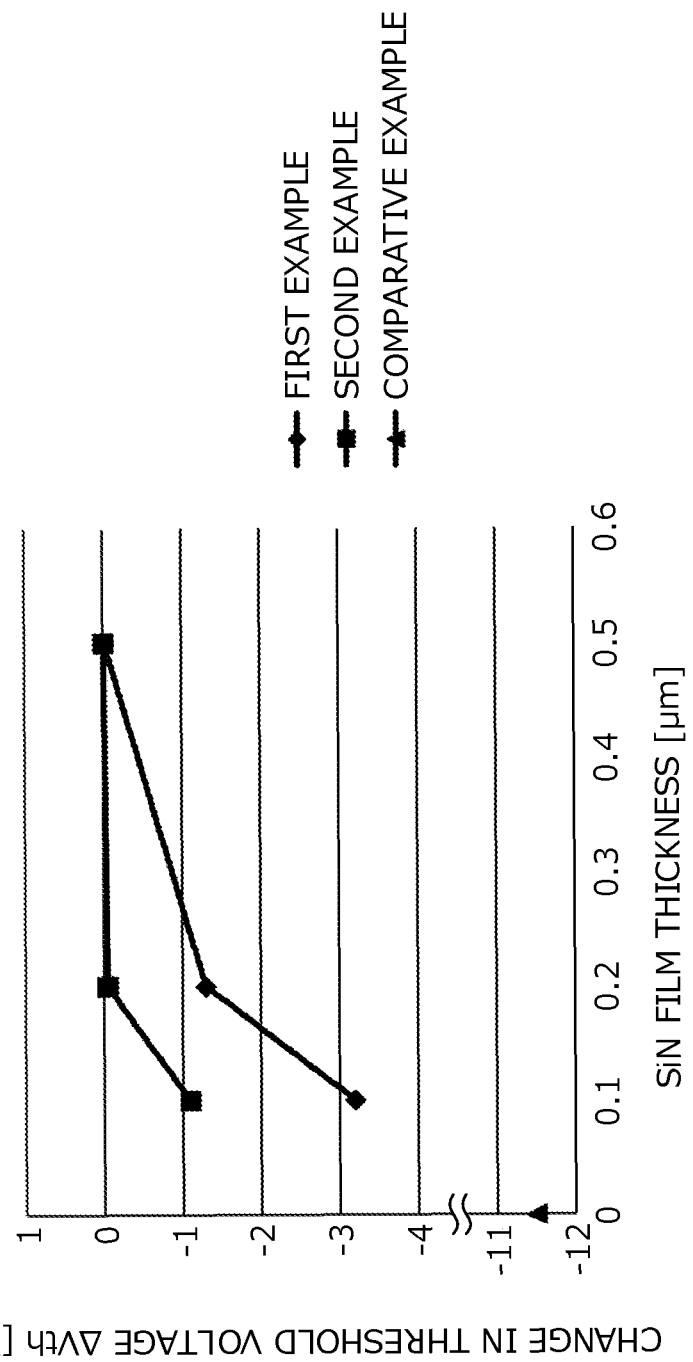
FIG. 7 is a property diagram of one example of threshold voltage change characteristics for a comparative example and a first example and a second example of the semiconductor device according to the first embodiment and a second embodiment of the present invention.

Threshold voltage (Vth) change (ΔVth) was evaluated for the first example and the comparative example. In the evaluation, ΔVth was defined as the difference of the initial threshold voltage value and the threshold voltage value after −20V was applied between the gate and the source for 10 minutes at 200 degrees C. Results of the ΔVth evaluation are discussed. FIG. 7 is a property diagram of one example of threshold voltage change characteristics for the comparative example and the first example and a second example of the semiconductor device according to the first embodiment and a second embodiment of the present invention. In FIG. 7, the vertical axis represents changes ΔVth in the threshold voltage Vth (V) and the horizontal axis represents the thickness of the silicon nitride film (μm). In the comparative example, the thickness of the silicon nitride film is zero. As depicted in FIG. 7, although the evaluation results indicate ΔVth to be at least −11V for the comparative example, it was confirmed that in the first example, ΔVth improved to a greater extent than in the comparative example. Further, it was confirmed that when the thickness of the silicon nitride film 11b was 0.5 μm or greater, ΔVth was improved to −0.1V or less.

According to the first embodiment, disposal of the silicon nitride film 11b in the interlayer insulating film 11 prevents element diffusion into the interface of the silicon oxide film and semiconductor, a cause of the threshold voltage decreases, and consequently, threshold voltage decreases are suppressed. As a result, property degradation of the semiconductor device 100 can be suppressed. Further, according to the first embodiment, for example, drops in reliability according to reliability tests such as high temperature gate bias (HTGB) tests can be avoided. According to the first embodiment, since the silicon oxide film 11a, which provides better coverage than the silicon nitride film 11b, is the layer below the silicon nitride film 11b, the coverage of the interlayer insulating film 11 is improved, enabling problems such as cracking to be avoided. Therefore, a function as an interlayer insulating film of a MOS structure is achieved and threshold voltage variation can be improved. Further, according to the first embodiment, since a titanium alloy barrier metal is unnecessary, apart from etching for the source electrode pad 14, additional etching for a titanium alloy need not be performed, enabling an increase in the number of processes at the time of manufacture to be suppressed.

Figure 8:
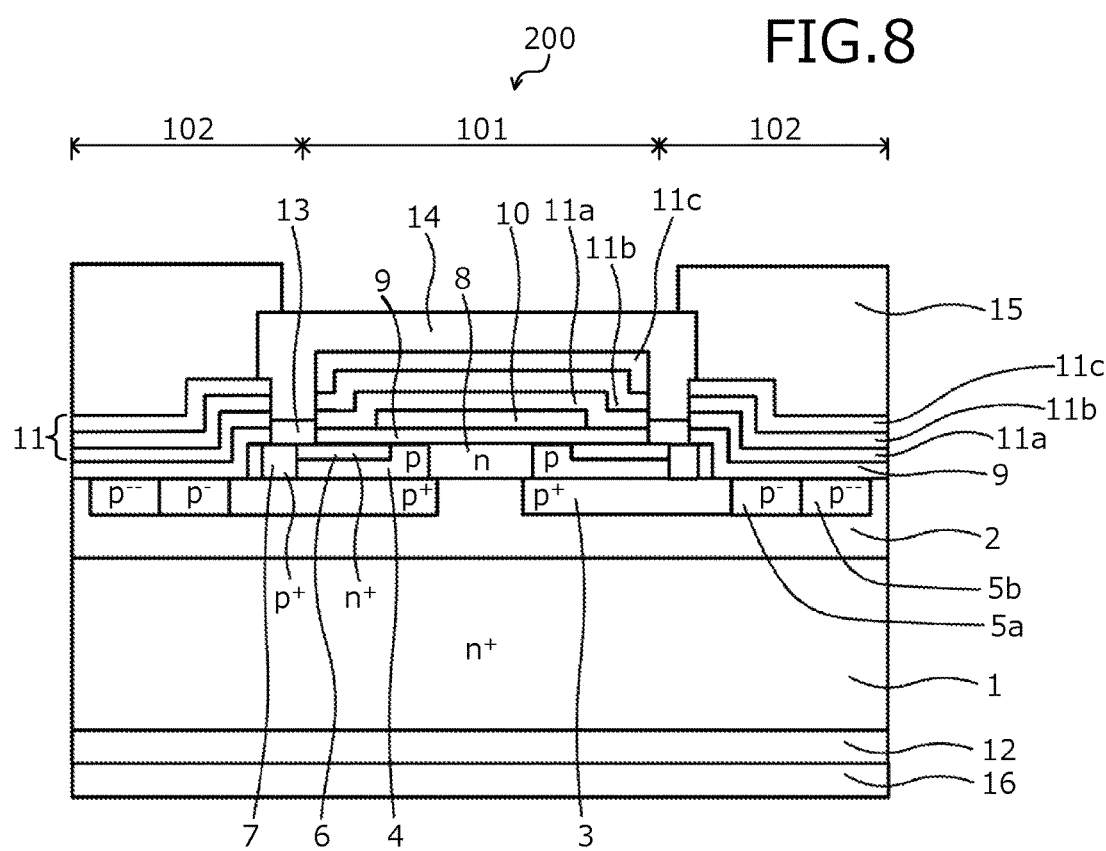
FIG. 8 is a cross-sectional view of an example of a semiconductor device according to the second embodiment of the present invention.

FIG. 8 is a cross-sectional view of an example of a semiconductor device according to the second embodiment of the present invention. As depicted in FIG. 8, a semiconductor device 200 according to the second embodiment has as the interlayer insulating film 11, the silicon oxide film 11a as a lower layer, the silicon nitride film 11b as an intermediate layer, and a second silicon oxide film 11c as an uppermost layer. Although the interlayer insulating film 11 may have a structure of 4 or more layers, in the second embodiment, description will be given for a 3-layer structure.

The second silicon oxide film 11c may be formed from, for example, nondoped silicate glass (NSG), or phosphor silicate glass (PSG). The second silicon oxide film 11c may be formed from, for example, boron and phosphorous in a silicon oxide (Boro-Phospho Silicate Glass (BPSG)). When the second silicon oxide film 11c is formed from BPSG, an effect may be achieved in that optimal planarization is realized by reflow.

In the semiconductor device 200 according to the second embodiment, components identical to those of the semiconductor device 100 described in the first embodiment are given the same reference numeral used in the first embodiment and will not be redundantly described.

Similar to the method of manufacturing the semiconductor device 100 according to the first embodiment, according to the second embodiment, the gate electrode 10 is disposed and after the silicon oxide film 11a forming the lower layer and the silicon nitride film 11b forming the intermediate layer in the interlayer insulating film 11 are disposed, the second silicon oxide film 11c forming the uppermost layer is formed. Thus, the interlayer insulating film 11 formed by the silicon oxide film 11a, the silicon nitride film 11b, and the second silicon oxide film 11c is formed.

The second silicon oxide film 11c, the silicon nitride film 11b, the silicon oxide film 11a, and the gate insulating film 9 are patterned and selectively removed, whereby a contact hole is formed, exposing the n$^+$ source regions 6 and the p$^+$ contact regions 7. Thereafter, heat treatment (reflow) is performed and the interlayer insulating film 11 is planarized. The method hereafter is identical to the method of manufacturing the semiconductor device 100 according to the first embodiment and therefore, redundant description is omitted herein.

The semiconductor device 200 in which the interlayer insulating film 11 is formed by the lower-layer silicon oxide film 11a, the intermediate-layer silicon nitride film 11b, and the uppermost-layer second silicon oxide film 11c is assumed as the second example. A semiconductor device where in the semiconductor device 200, the interlayer insulating film 11 is formed by only a silicon oxide film is assumed as a comparative example. The comparative example in the second embodiment is identical to the comparative example in the first embodiment.

Threshold voltage (Vth) change (ΔVth) was evaluated for the second example and the comparative example. In the evaluation, ΔVth was defined as the difference of the initial threshold voltage and the threshold voltage value after −20V was applied between the gate and the source for 10 minutes at 200 degrees C. As depicted in FIG. 7, the evaluation results confirm that in the second example, ΔVth improved to a greater extent that in the comparative example. Further, it was confirmed that when the thickness of the silicon nitride film 11b was 0.2 μm or greater, ΔVth was improved to −0.1V or less.

According to the second embodiment, similar to the first embodiment, disposal of the silicon nitride film 11b in the interlayer insulating film 11 suppressed threshold voltage decreases, enabling property degradation of the semiconductor device 200 to be suppressed. Further, according to the second embodiment, similar to the first embodiment, drops in reliability according to reliability tests can be avoided. According to the second embodiment, similar to the first embodiment, disposal of the silicon oxide film 11a in the interlayer insulating film 11 enables a function as an interlayer insulating film of a MOS structure to be achieved and threshold voltage variation to be improved. Further, according to the second embodiment, similar to the first embodiment, since a titanium alloy barrier metal is unnecessary, an increase in the number of processes at the time of manufacture may be suppressed.

The present invention is not limited to the embodiments above and various modifications are possible. For example, the plane orientation of the first principal surface of the $n^+$ semiconductor substrate 1 and the like may be changed. For example, the first principal surface of the $n^+$ semiconductor substrate 1 may be a plane that is parallel to a (0001) plane or a plane that is within 10 degrees with respect to a (0001) plane, for example, a (0001) plane having an off angle of 4 degrees in a <11-20> direction. For example, dimensions, concentrations, and the like described in the embodiments are examples and the present invention is not limited to these values. Further, in the embodiments, although a first conductivity is assumed as an n-type and a second conductivity type is assumed as a p-type, the present invention is applicable when the first conductivity is a p-type and the second conductivity is an n-type.

According to the present invention, in the interlayer insulating film, the layer formed of a silicon nitride film prevents element diffusion, which causes the threshold voltage at the interface of the silicon oxide film and the semiconductor to decrease. Thus, drops in the threshold voltage are suppressed.

Although a silicon nitride film has a high degree of hardness, making coverage thereof poorer than that of a silicon oxide film and making the silicon nitride film susceptible to cracking, as described, a silicon oxide film is disposed in a layer beneath the silicon nitride film, whereby the coverage is improved and problems such as cracking are avoided. Further, variation of the threshold voltage is reduced as compared to a case where in the interlayer insulating film, the layer formed by the silicon nitride film has a thickness that is less than 0.2 μm.

According to the present invention, threshold voltage decreases and degradation of semiconductor device properties can be suppressed. Further, increases in the number of processes at the time of manufacturing can be suppressed.

As described, a semiconductor device according to the present invention, for example, is useful in high-voltage semiconductor devices and is particularly suitable, for example, in high-voltage semiconductor devices used in power source devices such as power converters and various industrial machinery.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a semiconductor substrate of a first conductivity type formed of silicon carbide;
    a semiconductor layer of the first conductivity type, disposed on a first principal surface of the semiconductor substrate, and having an impurity concentration that is lower than that of the semiconductor substrate;
    a base region of a second conductivity type, disposed on a surface of the semiconductor layer;
    a source region of the first conductivity type, disposed in a first surface region of the base region;
    a contact region of the second conductivity type, disposed in a second surface region of the base region, and having an impurity concentration that is higher than that of the base region;
    a source electrode contacting the source region and the contact region;
    a gate insulating film disposed on a surface of the base region, the base region being disposed between the semiconductor layer and the source region;
    a gate electrode disposed on a surface of the gate insulating film;
    an interlayer insulating film extending between a surface of the gate electrode and the source electrode, and including a plurality of layers, the plurality of layers including silicon oxide layers sandwiching a silicon nitride layer so as to prevent an impurity from diffusing into the semiconductor device, the silicon oxide layer disposed on an upper surface of the silicon nitride layer comprising a silicon oxide glass containing boron and phosphorus; and
    a drain electrode disposed on a second principal surface of the semiconductor substrate.

2. The semiconductor device according to claim 1, wherein the silicon nitride layer has a thickness equal to or greater than 0.2 μm.

3. The semiconductor device according to claim 1, wherein the first principal surface of the semiconductor substrate is in a plane parallel to or tilted within 10 degrees of a plane whose a crystallographic plane index is (000-1).

4. The semiconductor device according to claim 1, wherein the first principal surface of the semiconductor substrate is in a plane parallel to or tilted within 10 degrees of a plane whose crystallographic plane index is (0001).

5. The semiconductor device according to claim 1, wherein the silicon nitride layer has a thickness equal to or greater than 0.5 μm.

6. A semiconductor device comprising:
    a semiconductor substrate of a first conductivity type formed of silicon carbide;

a semiconductor layer of the first conductivity type, disposed on a first principal surface of the semiconductor substrate, and having an impurity concentration that is lower than that of the semiconductor substrate;

a semiconductor region of a second conductivity type, disposed in a portion of a surface region of the semiconductor layer;

a base region disposed on a surface of the semiconductor region and having an impurity concentration that is lower than that of the semiconductor region;

a well region of the first conductivity type formed of a silicon carbide, disposed on the surface of the semiconductor layer, contacting the base region, and having an impurity concentration that is lower than that of the semiconductor substrate;

a source region of the first conductivity type, disposed in a surface region of the base region and away from the well region, and having an impurity concentration that is higher than that of the well region;

a contact region of the second conductivity type, disposed in a surface of the base region and contacting the source region, and having an impurity concentration that is higher than that of the base region;

a source electrode contacting the source region and the contact region;

a gate insulating film disposed on a surface of the base region, the base region being disposed between the well region and the source region;

a gate electrode disposed on a surface of the gate insulating film;

an interlayer insulating film extending between a surface of the gate electrode and a source electrode, and including a plurality of layers, the plurality of layers including silicon oxide layers sandwiching a silicon nitride layer so as to prevent an impurity from diffusing into the semiconductor device, the silicon oxide layer disposed on an upper surface of the silicon nitride layer comprising a silicon oxide glass containing boron and phosphorus; and a drain electrode disposed on a second principal surface of the semiconductor substrate.

7. The semiconductor device according to claim 6, wherein the silicon nitride layer has a thickness equal to or greater than 0.2 μm.

8. The semiconductor device according to claim 6, wherein the first principal surface of the semiconductor substrate is in a plane parallel to or tilted within 10 degrees of a plane whose crystallographic plane index is (000-1).

9. The semiconductor device according to claim 6, wherein the first principal surface of the semiconductor substrate is in a plane parallel to or tilted within 10 degrees of a plane whose crystallographic plane index is (0001).

10. The semiconductor device according to claim 6, wherein the silicon nitride layer has a thickness equal to or greater than 0.5 μm.

11. A method of manufacturing a semiconductor device, the method comprising forming of silicon carbide a semiconductor substrate a first conductivity type;

forming a semiconductor layer of the first conductivity type on a first principal surface of the semiconductor substrate, to have an impurity concentration lower than that of the semiconductor substrate;

forming a base region of a second conductivity type on a surface of the semiconductor layer;

forming a source region of the first conductivity type in a first surface region of the base region;

forming a contact region of the second conductivity type on a second surface region of the base region, to have an impurity concentration greater than that of the base region;

forming a gate insulating film on a surface of the base region, the base region being formed between the semiconductor layer and the source region;

forming a gate electrode on a surface of the gate insulating film;

forming an interlayer insulating film on a surface of the gate electrode, including forming the interlayer insulating film to include a plurality of layers, at least one of the plurality of layers being a silicon nitride layer, the plurality of layers including silicon oxide layers sandwiching the silicon nitride layer so as to prevent an impurity from diffusing into the semiconductor device, the silicon oxide layer formed on an upper surface of the silicon nitride layer comprising a silicon oxide glass containing boron and phosphorus;

forming a source electrode on the gate electrode, contacting the source region and the contact region; and forming a drain electrode on a second principal surface of the semiconductor substrate.

12. A method of manufacturing a semiconductor device, the method comprising forming of silicon carbide a semiconductor substrate of a first conductivity type;

forming a semiconductor layer of the first conductivity type on a first principal surface of the semiconductor substrate, to have an impurity concentration lower than that of the semiconductor substrate;

forming a semiconductor region of a second conductivity type in a portion of a surface region of the semiconductor layer;

forming a base region on a surface of the semiconductor region, to have an impurity concentration lower than that of the semiconductor region;

forming of a silicon carbide a well region of the first conductivity type, on the surface of the semiconductor layer and contacting the base region, to have an impurity concentration lower than that of the semiconductor substrate;

forming a source region of the first conductivity type, in a surface region of the base region and away from the well region, to have an impurity concentration greater than that of the well region;

forming a contact region of the second conductivity type, in a surface of the base region and contacting the source region, to have an impurity concentration greater than that of the base region;

forming a gate insulating film on a surface of the base region, the base region being formed between the well region and the source region;

forming a gate electrode formed on a surface of the gate insulating film;

forming a interlayer insulating film on a surface of the gate electrode, including forming the interlayer insulating film to include a plurality of layers, at least one of the plurality of layers as a silicon nitride layer, the plurality of layers including silicon oxide layers sandwiching the silicon nitride layer so as to prevent an impurity from diffusing into the semiconductor device, the silicon oxide layer formed on an upper surface of the silicon nitride layer comprising a silicon oxide glass containing boron and phosphorus;

forming a source electrode on the gate electrode, contacting the source region and the contact region; and forming a drain electrode on a second principal surface of the semiconductor substrate.

\* \* \* \* \*